United States Patent [19]

Chang et al.

[11] Patent Number: 5,422,846
[45] Date of Patent: Jun. 6, 1995

[54] NONVOLATILE MEMORY HAVING OVERERASE PROTECTION

[75] Inventors: Kuo-Tung Chang; Bruce L. Morton; Ko-Min Chang, all of Austin, Tex.

[73] Assignee: Motorola Inc., Schaumburg, Ill.

[21] Appl. No.: 222,066

[22] Filed: Apr. 4, 1994

[51] Int. Cl.⁶ .......................................... G11C 11/40
[52] U.S. Cl. ..................... 365/185; 365/218; 365/51; 365/63
[58] Field of Search ............. 365/185, 94, 103, 104, 365/218, 189.01, 51, 63

[56] References Cited

U.S. PATENT DOCUMENTS

| | | | |
|---|---|---|---|
| 4,751,678 | 6/1988 | Raghunathan | 365/189 |
| 4,773,047 | 9/1988 | Uchino et al. | 365/104 |
| 4,888,734 | 12/1989 | Lee et al. | 365/185 |
| 4,996,571 | 2/1991 | Kume et al. | 357/23.5 |
| 5,023,837 | 6/1991 | Schreck et al. | 365/185 |
| 5,067,108 | 11/1991 | Jenq | 365/185 |
| 5,103,425 | 4/1992 | Kuo et al. | 365/226 |
| 5,109,361 | 4/1992 | Yim et al. | 365/218 |
| 5,130,769 | 7/1992 | Kuo et al. | 357/23.5 |
| 5,185,718 | 2/1993 | Rinerson et al. | 365/185 |
| 5,258,949 | 11/1993 | Chang et al. | 365/185 |

FOREIGN PATENT DOCUMENTS

0495493A2 7/1992 European Pat. Off. ...... G11C 16/04

Primary Examiner—Joseph A. Popek
Assistant Examiner—Vu Le
Attorney, Agent, or Firm—Daniel D. Hill

[57] ABSTRACT

A nonvolatile memory (20) includes an array of floating gate transistors (22) organized as rows and columns. Word lines of adjacent rows are coupled together to form shared word lines. In one embodiment, a coupling transistor (56–61) is used to couple the sources of the floating gate transistors (36, 39–55) of a row to a predetermined potential in response to the shared word line being selected. The sources of the unselected floating gate transistors of the array (22) are isolated. In another embodiment, an inverter (113, 114, and 115) couples the sources to zero volts in response to the shared word line being selected. The conductivity of the floating gate transistors (36, 39–55) is controlled in response to the logic state of the shared word lines to ensure that unselected cells do not adversely affect the operation of the nonvolatile memory.

19 Claims, 2 Drawing Sheets

NONVOLATILE MEMORY HAVING OVERERASE PROTECTION

FIELD OF THE INVENTION

This invention relates generally to nonvolatile memories, and more particularly, to a nonvolatile memory with source decoding.

BACKGROUND OF THE INVENTION

A nonvolatile memory is a type of memory that retains stored data when power is removed. There are various types of nonvolatile memories, including read only memories (ROMs), programmable read only memories (PROMs), erasable programmable read only memories (EPROMs), electrically erasable programmable read only memories (EEPROMs), and flash EEPROMs. EEPROMs and flash EEPROMs are commonly used in data processing systems requiring a nonvolatile memory that is re-programmable.

Both ROM and PROM generally include an array of single transistor memory cells. In a ROM, the logic state of a memory cell is determined by adjusting the threshold voltage ($V_T$) of the transistor. The $V_T$ of a transistor determines what $V_{GS}$ (gate to source voltage) will cause the transistor to be conductive and non-conductive. The $V_T$ of a ROM is preprogrammed by the manufacturer. In a PROM, the logic state of a memory cell is also determined by the $V_T$ of the transistor, but the $V_T$ is one-time programmable by the user. The logic state of the memory cells in ROMs and PROMs cannot be altered once they are programmed.

An EEPROM and an EPROM generally includes an array of floating gate, single transistor memory cells. An EPROM is electrically programmed, but the entire memory array is bulk erased using ultraviolet (UV) light. In contrast, an EEPROM and a flash EEPROM are electrically programmed and electrically erased. The term "flash" refers to the fact that the flash EEPROM can be bulk erased much more quickly than an EPROM. It may take less than two minutes to erase a flash EEPROM memory cell, compared to about 20 minutes to erase an EPROM with UV light.

A nonvolatile memory that uses floating gate transistors is usually programmed to have a different $V_T$ from that of the unprogrammed floating gate transistors. The difference in the $V_T$ between a programmed floating gate transistor and an unprogrammed floating gate transistor causes a difference in the conductivity of the floating gate transistor. The difference in conductivity is used to distinguish between a logic "one" and a logic "zero". A floating gate transistor can be erased and reprogrammed to a new logic state when necessary.

There are various ways to program and erase a floating gate transistor. For example, a floating gate transistor can be programmed by using hot carrier injection to transport electrons to the floating gate, thus raising the $V_T$. The floating gate transistor can then be erased by using Fowler-Nordheim tunneling to transport electrons from floating gate to the source terminal, thereby lowering the $V_T$.

Another way to program the floating gate transistor is by using Fowler-Nordheim tunneling to transport electrons from the floating gate to the drain, and to erase the floating gate transistor by using Fowler-Nordheim tunneling to transport electrons to the floating gate. Lowering the $V_T$ programs the floating gate transistor, and raising the $V_T$ erases the floating gate transistor. Regardless of the method used to program and erase the floating gate transistor, the effect of trapping electrons on the floating gate is to raise the $V_T$ of the floating gate transistor such that there is no conductive path through the floating gate transistor during a read operation of the nonvolatile memory. The removal of the electrons from the floating gate lowers the $V_T$ of the floating gate transistor such that the floating gate transistor provides a conductive path during a read operation of the nonvolatile memory.

For proper operation during a read cycle, a minimum amount of current should flow through a selected floating gate transistor that has a lowered $V_T$. For a predetermined cell size, the amount of current flowing through the floating gate transistor is determined by the $V_T$ and the $V_{GS}$. The amount the $V_T$ is shifted during programming and erasing must be controlled to ensure proper operation of the nonvolatile memory. For example, if the $V_T$ of the unselected floating gate transistor is shifted too low, the unselected floating gate transistor may not be sufficiently non-conductive, thus adversely affecting the operation of the entire memory.

During a read cycle, the $V_{GS}$ of a selected memory cell is usually equal to the power supply voltage, which is 5 volts in most of the applications. However, as nonvolatile memories are being designed to operate at lower power supply voltages, such as 3 volts, 1.8 volts, or even as low as 0.9 volts, the $V_T$ must be even more precisely controlled for proper operation. At 0.9 volts, the lower $V_T$ limit is required to be slightly above zero volts for achieving the required current during a read cycle. In ROMs, PROMs, and EPROMs, the lower $V_T$ limit can be achieved by adjusting the manufacturing process. In EEPROMs, and flash EEPROMs, the lower $V_T$ limit can be achieved by removing more electrons from the floating gate. However, this lower $V_T$ may not fall within the prescribed range, and may even become negative, causing the floating gate transistor to "leak" current, or be conductive when a word line to which it is coupled is not selected.

SUMMARY OF THE INVENTION

Accordingly, there is provided, in one form, a nonvolatile memory having a plurality of nonvolatile memory cells and a coupling portion. The plurality of nonvolatile memory cells are arranged in rows and columns. Each nonvolatile memory cell includes a first terminal coupled to a bit line, a second terminal coupled to a word line, and a third terminal. A word line of a first row of nonvolatile memory cells is coupled to a word line of a second row of nonvolatile memory cells to form a shared word line. Each nonvolatile memory cell that is coupled to the shared word line is coupled to a separate bit line. The coupling portion is for coupling the third terminal of the nonvolatile memory cell to a reference potential in response to the shared word line being selected during a read cycle of the nonvolatile memory. These and other features and advantages will be more clearly understood from the following detailed description taken in conjunction with the accompanying drawings.

DESCRIPTION OF A PREFERRED EMBODIMENT

Generally, the present invention provides a nonvolatile memory having shared word lines that provides reliable operation at low power supply voltages, or when the nonvolatile memory cells are operated at low $V_T$. This is accomplished by controlling the conductivity of the floating gate transistors in response to the logic state of the shared word lines, thereby ensuring that unselected cells do not adversely affect the operation of the nonvolatile memory.

Figure 1:
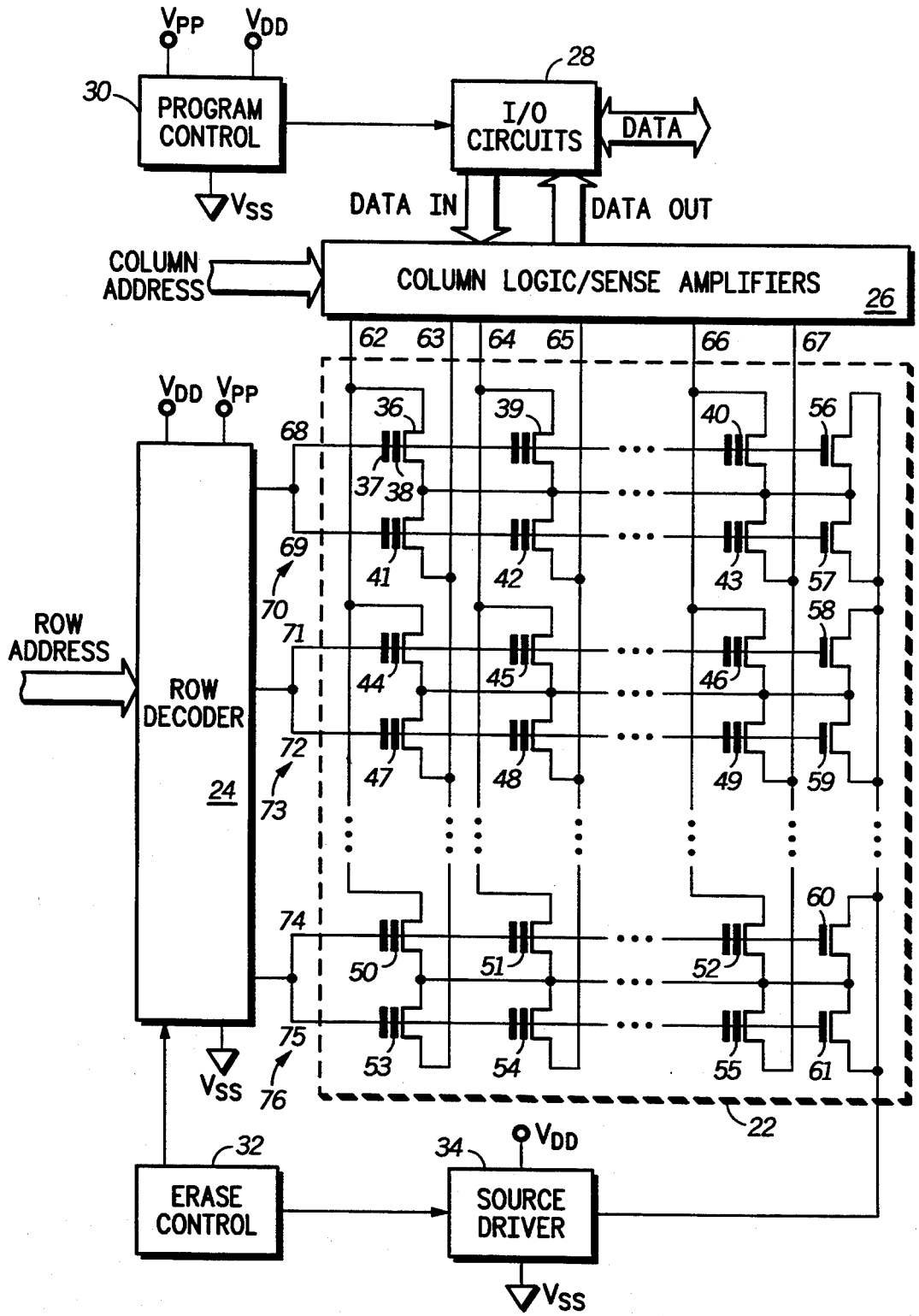
FIG. 1 illustrates in partial block diagram form and partial schematic diagram form, a nonvolatile memory in accordance with an embodiment of, the present invention.
Figure 2:
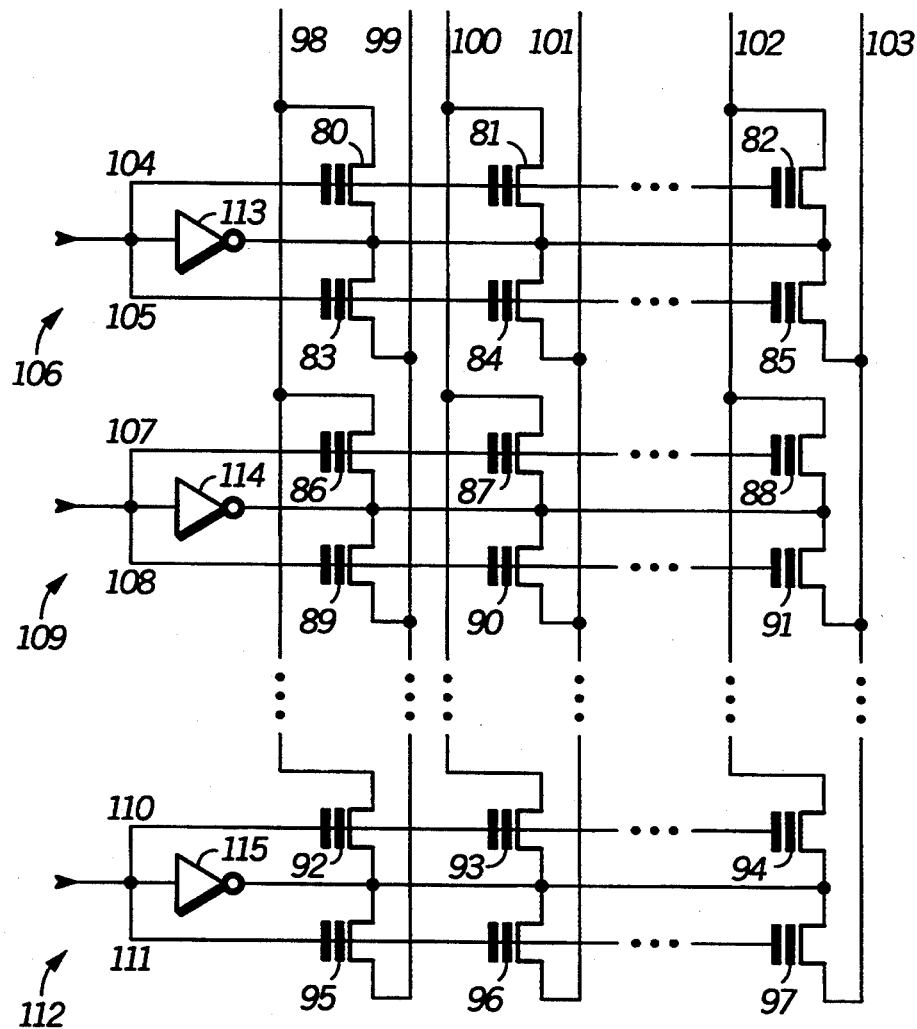
FIG. 2 illustrates in partial logic diagram form and partial schematic diagram form, a nonvolatile memory array in accordance with another embodiment of the present invention.

The present invention can be more fully described with reference to FIGS. 1-2. FIG. 1 illustrates in partial block diagram form and partial schematic diagram form, nonvolatile memory 20 in accordance with an embodiment of the present invention. Nonvolatile memory 20 includes memory array 22, row decoder 24, column logic/sense amplifiers 26, I/O circuits 28, program control 30, erase control circuit 32, and source driver 34. FIG. 2 illustrates memory array 22', that can be substituted for memory array 22 in another embodiment of the present invention.

Nonvolatile memory array 22 includes floating gate transistors 36, 39-55, bit lines 62-67, word lines 68, 69, 71, 72, 74, and 75, and coupling transistors 56-61. Each floating gate transistor includes a control gate, a floating gate, a drain, and a source. For example, floating gate transistor 36 has a control gate 37 coupled to word line 68, a floating gate 38, a drain coupled to bit line 62, and a source.

Nonvolatile memory array 22 is arranged in row and columns. Floating gate transistors 36, 44, and 50 are coupled to bit line 62 and comprise a single column of nonvolatile memory array 22. Likewise, floating gate transistors 41, 47, and 53 and bit line 63 comprise another column of nonvolatile memory cells. The bit line layout used in memory array 22 is sometimes referred to as split bit lines. Memory array 22 requires twice as many bit lines as a conventional memory, which results in an increase in the area required for layout of the array. However, there is an effective doubling of the row pitch which allows more efficient layout of row decoding circuitry. Also, voltage boosting circuits are not necessary in low voltage applications, which may further offset the size the larger layout size. Bit lines 62-67 are coupled to column logic/sense amplifiers 26.

Word line 68 and floating gate transistors 36, 39, and 40 comprise a row of nonvolatile memory array 22. Word line 69 and cells 41, 42, and 43 comprise another row of nonvolatile memory array 22. Adjacent rows of memory cells have their word lines connected together to form shared word lines. Word line 68 is coupled to word line 69 to form shared word line 70. Word lines 71 and 72 form shared word line 73. Word lines 74 and 75 form shared word line 76. Shared word lines 70, 73, and 76 are connected to row decoder 24.

Coupling transistor 56 has a first drain/source terminal coupled to the sources of floating gate transistors 36, 39, 40, 41, 42, and 43, a gate coupled to word line 68, and a second drain/source terminal coupled to source driver 34. Coupling transistor 56 couples the sources of floating gate transistors 36, 39, and 40 to source driver 34 in response to word line 68 being selected for either a read cycle, a program cycle, or an erase cycle of memory 20. The other coupling transistors 57-61 couple the sources of floating gate transistors coupled to their respective word lines to source driver 34 in response to their respective word lines being selected.

Column logic/sense amplifiers 26 includes column address decoders and sense amplifiers for selecting bit lines and providing data to and from nonvolatile memory array 22. Column logic/sense amplifiers 26 receives a column address labeled "COLUMN ADDRESS", data input signals labeled "DATA IN", and provides data output signals labeled "DATA OUT". Column logic/sense amplifiers 26 is coupled to bit lines 62-67.

Row decoder 24 is coupled to a first power supply voltage terminal labeled "$V_{DD}$", a programming voltage terminal labeled "$V_{pp}$", a second power supply voltage terminal labeled "$V_{SS}$" and receives a row address labeled "ROW ADDRESS". In response to receiving row address ROW ADDRESS, row decoders 24 selects a word line for an active cycle of memory 20 including a read cycle, a program cycle, or an erase cycle. A nonvolatile memory cell of memory array 22 is selected for an active cycle when the bit line to which it is coupled is selected and the word line to which it is coupled is enabled. Note that row decoder 24 also includes word line drivers (not shown). Also note that the amount of decoding performed by row decoder 24 and column logic/sense amplifiers 26 can be different in other embodiments is not important for describing the invention.

Erase control circuit 32 has a first output terminal connected to row decoder 24, and a second output terminal connected to an input terminal of source driver 34. Source driver 34 is connected to $V_{DD}$, and to second power supply voltage terminal $V_{SS}$.

Program control circuit 30 controls the programming cycle of memory 20. Program control circuit 30 has a first input terminal connected to $V_{pp}$, a second input terminal connected to $V_{DD}$, a third input terminal connected to $V_{SS}$, and an output terminal. I/O (input/output) circuits 28 has an input terminal connected to the output terminal of program control circuit 30, and data terminals connected to column logic/sense amplifiers 26 for receiving and providing data signals DATA OUT and DATA IN, respectively. I/O circuits 28 include data buffer circuits for inputting and outputting data labeled "DATA" to data pads (not shown).

$V_{pp}$ is used for programming and erasing nonvolatile memory array 22. $V_{pp}$ may be a high voltage from an external source, or may be generated on the same integrated circuit as memory 20 using conventional charge pump circuitry. $V_{pp}$ may be between 10 and 15 volts or between $-8$ and $-12$ volts depending on the particular method used for programming. The actual value for $V_{pp}$ depends on various factors such as the thickness of the tunnel oxide, the planned program and erase speed, and on the predetermined $V_T$ margin between programmed and unprogrammed cells.

Memory 20 can be adapted for use with different kinds of nonvolatile memory cells. Nonvolatile memory array 22 may be comprised of ROM, PROM, EPROM, EEPROM, or flash EEPROM cells. A storage cell of memory array 22 can be comprised of single transistor memory cells, or two or more transistor memory cells. In the illustrated embodiments, the storage cells are comprised of floating gate transistors 36, and 39-55. Floating gate transistors 36 and 39-55 are conventional floating gate transistors, such as self-aligned floating gate transistors, non-self-aligned floating gate transistors.

Programming of memory 20 using memory array 22 may be accomplished in several ways. In a preferred embodiment, Fowler-Nordheim tunneling is used to transport electrons from the floating gate to the drain of the floating gate transistors. Programming of the floating gate transistors by Fowler-Nordheim tunneling is achieved by applying a negative voltage to the control gate and a positive voltage to the drain of the memory cells to be programmed. An electric field between the floating gate and the drain removes electrons from the floating gate. Removing electrons from the floating gate lowers the $V_T$, thus programming the floating gate transistor. For floating gate transistors that are to remain unprogrammed, the drain is provided with zero volts, and the electric field between the floating gate and the drain terminal will not be high enough to remove electrons from the floating gate. This allows the unprogrammed floating gate transistors to maintain a high $V_T$.

During programming of memory array 22, a negative programming voltage $V_{pp}$ is provided by a charge pump circuit (not shown) to row decoder 24. Row decoder 24 receives row address ROW ADDRESS, and in response, selects one of shared word lines 70, 73, and 76 to receive $V_{pp}$. The unselected rows are provided with a zero volt potential. Data signals DATA IN are provided by column logic 26 to bit lines 62–67, such that all the floating gate transistors along the same shared word line are selected to be programmed or not programmed at the same time. This programming scheme is commonly known as "page programming".

Data signals DATA IN, that are to be programmed into the selected cells, are provided by column logic/sense amplifiers 26 to bit lines 62–67. For a memory cell that is to be programmed, the bit line receives a positive voltage which is applied to the drain of the selected floating gate transistor. For an unprogrammed memory bit, the bit line will receive zero volts which is coupled to the drain of the floating gate transistor. Depending on whether the drain is at a positive voltage or zero volts, the memory cell is programmed to a low $V_T$, or remains unprogrammed with a high $V_T$. A programmed floating gate transistor stores a logic "one" and an unprogrammed floating gate transistor stores a logic "zero".

Memory array 22 may be erased in several ways. In a preferred embodiment, Fowler-Nordheim tunneling is used to transport electrons from the source to the floating gate. Erasing of the floating gate transistors by Fowler-Nordheim tunneling is achieved by applying a high positive voltage to the control gate while grounding the source and drain. The high electric field between the floating gate and the source injects electrons into the floating gate. This results in the erased transistor having a higher $V_T$ than a programmed transistor. All of memory array 22 is erased at the same time. However, erasing only part of memory array 22 can be accomplished by providing extra circuitry to partition memory array 22 into smaller sections, or blocks (not shown).

Erase control circuit 32 causes a high positive programming voltage $V_{pp}$ to be provided to the control gate of each memory cell 36, and 39–55 through row decoder 24. The drain and source are grounded by column logic/sense amplifiers 26 and source driver 34, respectively. Coupling transistors 56–61 are conductive, and couple a zero volt potential from source drive 34 to all the sources of memory cells 36, and 39–55.

To read data from memory array 22, row decoder 24 receives row address ROW ADDRESS for selecting one of shared word lines 70, 73, or 76. Column logic/sense amplifiers 26 receives column address COLUMN ADDRESS to select of one of bit lines 62–67 to be coupled to the sense amplifiers of column logic/sense amplifiers 26.

Row decoder 24 provides $V_{DD}$ to the selected shared word line of shared word lines 70, 73, and 76. The unselected shared word lines are provided with zero volts. The coupling transistor that is coupled to the selected word line is conductive (one of coupling transistors 56–61), which couples the sources of the selected cells to zero volts, or ground potential. Also, zero volts is provided to the unselected word lines to keep the associated coupling transistors non-conductive, thus isolating the unselected rows from ground potential.

If the selected floating gate transistor has been programmed to have a low $V_T$, the selected floating gate transistor will become conductive when the corresponding word line is selected during a read cycle, and the sense amplifier of column logic/sense amplifiers 26 detects the logic "one" that is provide to the corresponding bit line. The sense amplifier of column logic/sense amplifiers 26 amplifies the sensed logic "one", and provides data out signal DATA OUT to I/O circuits 28. If the floating gate transistor is unprogrammed and has a high $V_T$, the low conductance of the floating gate transistor keeps the bit line voltage at a predetermined voltage, which the sense amplifier identifies as an unprogrammed, or erased state, and provides a logic "zero" data out signal DATA OUT to I/O circuits 28.

Since the logic states of the floating gate transistors are determined by the conductance of the transistor, the required low $V_T$ level for a programmed transistor may need to be further reduced for low $V_{DD}$ applications to ensure adequate current during a read cycle of memory 20. However, if the low $V_T$ state is close to zero volts, or becomes negative, the floating gate transistor becomes "leaky" or partially conductive, even when zero volts is applied to the control gate of the unselected word lines. Coupling transistors 56–61 provide isolation for the unselected rows and provides a means of preventing current through the floating gate transistors of unselected rows. This allows the low $V_T$ of the programmed floating gate transistor to be close to zero volts, or even negative, and still allow enough current for a read operation.

Since coupling transistors 56–61 are N-channel transistors, they may be relatively easily incorporated into memory array 22. Also, coupling transistors 56–61 have their gates coupled to the same shared word lines as the floating gate transistors of a row, thereby eliminating the need for an extra select line. In addition, isolation of the sources of the floating gate transistors prevents the floating gate transistors having a low $V_T$ from causing errors during a read cycle and allows the use of lower power supply voltages.

FIG. 2 illustrates in partial logic diagram form and partial schematic diagram form, nonvolatile memory array 22' in accordance with another embodiment of the present invention.

Nonvolatile memory array 22' includes floating gate transistors 80–97, bit lines 98–103, word lines 104, 105, 107, 108, 110, and 111, and inverters 113, 114, and 115.

Floating gate transistors 80–97 are similar to floating gate transistor 36 of FIG. 1.

Nonvolatile memory array 22' can be substituted for memory array 22 in memory 20. Bit lines 98–103 are coupled to column logic/sense amplifiers 26. Like nonvolatile memory array 22, nonvolatile memory array 22' is arranged in row and columns. Floating gate transistors 80, 86, and 92 are coupled to bit line 98 and comprise a single column of nonvolatile memory array 22'. Likewise, floating gate transistors 83, 89, and 95 and bit line 99 comprise another column of nonvolatile memory cells. Memory array 22' requires twice as many bit lines as a conventional memory. The bit line layout used in memory array 22 is known as "split" bit lines.

Word line 104 and floating gate transistors 80, 81, and 82 comprise a row of nonvolatile memory array 22'. Word line 105 and cells 83, 84, and 85 comprise another row of nonvolatile memory array 22'. Word line 104 is coupled to word line 105 to form shared word line 106. Word lines 107 and 108 form shared word line 109. Word lines 110 and 111 form shared word line 112.

Inverter 113 has an input terminal connected to shared word line 106, and an output terminal connected the sources of floating gate transistors 80–85. Inverter 114 has an input terminal connected to shared word line 109, and an output terminal connected the sources of floating gate transistors 86–91. Inverter 115 has an input terminal connected to shared word line 112, and an output terminal connected to the sources of floating gate transistors 92–97.

Programming of memory 20 using memory array 22' may be accomplished in several ways. In a preferred embodiment, hot carrier injection is used to program floating gate transistors 80–97. Hot carrier injection programming of memory 20 requires selection of one shared row and at least one column in response to the application of appropriate row and column address signals.

During programming, row address ROW ADDRESS is applied to row decoder 24, driving one of shared row lines 106, 109 or 112, to a logic high state. The logic high state for a shared word line is a potential substantially greater than $V_{DD}$ and is supplied from $V_{pp}$ through program control 30. In response to its associated shared word line becoming a logic high, one of inverters 113, 114, or 115, drives its associated floating gate transistor sources to a logic low. Typically, a logic low for the floating gate transistor sources is zero volts. The unselected shared word lines are held at about zero volts, causing inverters 113, 114, and 115 to hold the source lines to a positive potential. The gate of each unselected floating gate transistor is negatively biased relative to the source. The negative bias ensures that each floating gate transistor in an unselected row is non-conductive, even if its $V_T$ is so low as to be characterized as over-erased.

Selection of a column of memory cells is accomplished by column logic/sense amplifiers 26 in response to the application of a column address COLUMN ADDRESS to memory 20. A selected column is one whose associated bit line is coupled to I/O circuits 28 through column logic/sense amplifiers 26. An unselected column is one whose associated bit line is not connected to I/O circuits 28 through column logic/sense amplifiers 26.

To program data into a floating gate transistor in memory array 22', both the shared row and the column associated with that transistor are selected. Data in signals DATA IN are received through I/O circuits 28, through column logic/sense amplifiers 26, and act on a selected bit line in one of two ways, depending on the logic state of data signals DATA IN. If a data bit associated with the selected floating gate transistor is a logic "one", a potential substantially greater than $V_{DD}$, supplied from $V_{pp}$ through program control 30, is applied to the associated bit line. The floating gate transistor then conducts a high current and is programmed by means of hot carrier injection. If the data bit associated with the selected floating gate transistor is a logic "zero", the bit line is allowed to float, and the floating gate transistor remains in an erased state.

Erasing of memory 20 using memory array 22' may be accomplished in several ways. In a preferred embodiment, all floating gate transistors are erased simultaneously. Shared word lines 106, 109 and 112 are held at zero volts, causing the output terminals of inverters 113, 114 and 115 to be raised to a high positive potential. Inverters 113, 114, and 115 force the floating gate transistor sources to a high positive potential causing electrons to transfer from the floating gates, thus lowering the $V_T$. When the $V_T$ of the floating gate transistors is sufficiently low, the floating gate transistor is considered to be erased.

During a read cycle of memory 20, one shared row and at least one column is selected in response to the application of appropriate row and column address signals. The shared word lines of unselected rows are held at zero volts. Inverters 113, 114 and 115 hold memory array source lines at a positive potential. The gate of each floating gate transistor in an unselected row is negatively biased relative to the source. The negative bias ensures that each floating gate transistor in an unselected row is not conductive, even if its $V_T$ is so low as to be characterized as over-erased. To select a row, row address ROW ADDRESS is applied to memory 20, driving one of shared word lines 106, 109, or 112, to a logic high. The logic high for a shared word line would be a potential equal to or greater than $V_{DD}$. In response to its associated shared word line becoming a logic high, one of inverters 113, 114, or 115 drives its associated floating gate transistor sources to a logic low. A logic low for a floating gate transistor source is zero volts. In a selected row, any erased floating gate transistors will exhibit substantial conductance from drain to source and will permit current to flow from the associated bit lines to zero volts (or $V_{SS}$).

Selection of a column is accomplished by the column logic/sense amplifiers 26 in response to the application of column address COLUMN ADDRESS. A selected column is one whose associated bit line is coupled to a sense amplifier through column logic within column logic/sense amplifiers 26. An unselected column is one whose associated bit line is not connected to a sense amplifier within column logic/sense amplifiers 26. A sense amplifier produces a logic "zero" at its output terminal when connected to a bit line that exhibits a conductance to ground exceeding a predetermined level. The absence of such conductance causes the sense amplifier to produce a logic "one" at its output terminal. Column logic/sense amplifiers 26 may be configured to select one or more bit lines in response to a valid column address signal.

To read the data stored in a floating gate transistor in memory array 22', both the shared word lines and the bit line associated with a particular floating gate transistor are selected. If the floating gate transistor is erased, the sense amplifier detects a conductance to $V_{SS}$ and produces a logic "zero" at its output terminal. If the floating gate transistor is programmed, its conductance is low, even though its shared word line is selected, and the sense amplifier produces a logic "one" at its output terminal. Depending on the data configuration of column logic/sense amplifiers 26, one or more floating gate transistors associated with a shared word line may be read simultaneously.

In memory array 22', a negative bias of predetermined magnitude is forced from the gates to the sources of the unselected floating gate transistors. An advantage of this characteristic is that unselected floating gate transistors are biased such that they may not conduct current from bit lines to shared source lines. If left floating when unselected, as in memory array 22, the shared sources may allow floating gate transistors that are unselected and erased to become conductive during a read operation. This conductivity would allow undesirable interaction between the bit lines and, depending the design of column logic/sense amplifiers 26 as well as other factors, prevent correct sensing of the data stored in the selected floating gate transistors.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A nonvolatile memory, comprising:
   a plurality of nonvolatile memory cells arranged in rows and columns, a nonvolatile memory cell of the plurality of nonvolatile memory cells including a first terminal coupled to a bit line, a second terminal coupled to a word line, and a third terminal;
   wherein a word line of a first row of nonvolatile memory cells is coupled to a word line of a second row of nonvolatile memory cells to form a shared word line, each nonvolatile memory cell that is coupled to the shared word line is coupled to a separate bit line; and
   coupling means for coupling the third terminal of the nonvolatile memory cell to a reference potential in response to the shared word line being selected.

2. The nonvolatile memory of claim 1, wherein the plurality of nonvolatile memory cells comprises a plurality of read only memory (ROM) cells.

3. The nonvolatile memory of claim 1, wherein the nonvolatile memory cell comprises a floating gate transistor having a control gate, a floating gate, a drain, and a source.

4. The nonvolatile memory of claim 3, wherein the plurality of nonvolatile memory cells comprises a plurality of erasable programmable read only memory (EPROM) cells.

5. The nonvolatile memory of claim 3, wherein the plurality of nonvolatile memory cells comprises a plurality of electrically erasable programmable read only memory (EEPROM) cells.

6. The nonvolatile memory of claim 3, wherein the plurality of nonvolatile memory cells comprises a plurality of flash electrically erasable programmable read only memory cells.

7. The nonvolatile memory of claim 1, wherein the coupling means comprises:

a first transistor having a first current electrode coupled to the third terminal of each nonvolatile memory cell of the first row of nonvolatile memory cells, a control electrode coupled to the shared word line, and a second current electrode coupled to the reference potential, the first transistor for coupling the third terminal of each of the nonvolatile memory cells of the first row of the plurality of nonvolatile memory cells to the reference potential in response to the shared word line being selected; and a second transistor having a first current electrode coupled to the third terminal of each nonvolatile memory cell comprising the second row of nonvolatile memory cells, a control electrode coupled to the shared word line, and a second current electrode coupled to the reference potential, the second transistor for coupling the third terminal of each of the nonvolatile memory cells of the second row of the plurality of nonvolatile memory cells to the reference potential in response to the shared word line being selected.

8. The nonvolatile memory of claim 1, wherein the reference potential is equal to approximately zero volts.

9. The nonvolatile memory of claim 1, wherein the coupling means comprises an inverter for providing zero volts to the third terminal of the nonvolatile memory cell in response to the shared word line being selected.

10. The nonvolatile memory of claim 9, wherein the inverter provides a logic high voltage to the third terminal of the nonvolatile memory cell in response to the shared word line being unselected.

11. A nonvolatile memory, comprising:
   a plurality of nonvolatile memory cells arranged in rows and columns, a nonvolatile memory cell of the plurality of nonvolatile memory cells including a floating gate transistor, the floating gate transistor having a first current electrode coupled to a bit line, a control gate coupled to a word line, and a second current electrode;
   wherein a word line of a first row of nonvolatile memory cells is coupled to a word line of a second row of nonvolatile memory cells to form a shared word line, each nonvolatile memory cell that is coupled to the shared word line is coupled to a separate bit line;
   a first transistor having a first current electrode coupled to the second current electrode of each floating gate transistor comprising a first row of nonvolatile memory cells, a control electrode coupled to the shared word line, and a second current electrode coupled to a reference potential, the first transistor for coupling the second current electrode of each of the floating gate transistors of the first row of the plurality of nonvolatile memory cells to the reference potential in response to the shared word line being selected; and
   a second transistor having a first current electrode coupled to the second current electrode of each floating gate transistor comprising a second row of nonvolatile memory cells, a control electrode coupled to the shared word line, and a second current electrode coupled to the reference potential, the second transistor for coupling the second current electrode of each of the floating gate transistors of the second row of the plurality of nonvolatile memory cells to the reference potential in response to the shared word line being selected.

12. The nonvolatile memory of claim 11, wherein the reference potential is equal to approximately zero volts.

13. The nonvolatile memory of claim 11, wherein the plurality of nonvolatile memory cells is characterized as being a plurality of flash electrically erasable programmable read only memory cells.

14. The nonvolatile memory of claim 11, wherein the plurality of nonvolatile memory cells is characterized as being a plurality of electrically erasable programmable read only memory (EEPROM) cells.

15. A nonvolatile memory, comprising:
a plurality of nonvolatile memory cells arranged in rows and columns, each nonvolatile memory cell of the plurality of nonvolatile memory cells including a floating gate transistor having a control gate, a floating gate, a drain, and a source;
wherein a word line of a first row of nonvolatile memory cells is coupled to a word line of a second row of nonvolatile memory cells to form a shared word line, each nonvolatile memory cell that is coupled to the shared word line is coupled to a separate bit line; and
an inverter having an input terminal coupled to the shared word line, and an output terminal coupled to the source of each floating gate transistor of the first and second rows of nonvolatile memory cells.

16. The nonvolatile memory of claim 15, wherein the inverter provides zero volts to the sources of the nonvolatile memory cells of the first and second rows in response to the shared word line being selected.

17. The nonvolatile memory of claim 15, wherein the inverter provides a logic high voltage to the sources of the nonvolatile memory cells of the first and second rows in response to the shared word line being unselected.

18. The nonvolatile memory of claim 15, wherein the plurality of nonvolatile memory cells is characterized as being a plurality of flash electrically erasable programmable read only memory cells.

19. The nonvolatile memory of claim 15, wherein the plurality of nonvolatile memory cells is characterized as being a plurality of electrically erasable programmable read only memory (EEPROM) cells.

* * * * *